(12) United States Patent
Mallikarjunaswamy et al.

(10) Patent No.: US 10,373,947 B2
(45) Date of Patent: Aug. 6, 2019

(54) LOW CAPACITANCE BIDIRECTIONAL TRANSIENT VOLTAGE SUPPRESSOR

(71) Applicant: Alpha and Omega Semiconductor (Cayman) Ltd., Grand Cayman (KY)

(72) Inventors: Shekar Mallikarjunaswamy, San Jose, CA (US); Ning Shi, San Jose, CA (US)

(73) Assignee: Alpha and Omega Semiconductor (Cayman) Ltd., Grand Cayman (KY)

( * ) Notice: Subject to any disclaimer, the term of this patent is extended or adjusted under 35 U.S.C. 154(b) by 0 days.

(21) Appl. No.: 16/045,570

(22) Filed: Jul. 25, 2018

(65) Prior Publication Data

US 2018/0342499 A1 Nov. 29, 2018

Related U.S. Application Data

(63) Continuation of application No. 15/605,662, filed on May 25, 2017, now Pat. No. 10,062,682.

(51) Int. Cl.
| | |
|---|---|
| *H01L 27/02* | (2006.01) |
| *H01L 29/06* | (2006.01) |
| *H01L 29/866* | (2006.01) |
| *H01L 23/535* | (2006.01) |
| *H01L 29/861* | (2006.01) |
| *H01L 29/87* | (2006.01) |

(52) U.S. Cl.
CPC ........ *H01L 27/0262* (2013.01); *H01L 23/535* (2013.01); *H01L 27/0255* (2013.01); *H01L 29/0649* (2013.01); *H01L 29/866* (2013.01); *H01L 29/8611* (2013.01); *H01L 29/87* (2013.01)

(58) Field of Classification Search
CPC ............... H01L 23/535; H01L 27/0255; H01L 27/0262; H01L 29/0649; H01L 29/8611; H01L 29/866; H01L 29/87
USPC ......... 257/124, 274, 173, 146, 112; 438/512
See application file for complete search history.

(56) References Cited

U.S. PATENT DOCUMENTS

| | | | | |
|---|---|---|---|---|
| 3,609,413 | A * | 9/1971 | Lane ................... | H01L 27/0248 257/552 |
| 4,633,283 | A * | 12/1986 | Avery ................. | H01L 27/0248 257/122 |
| 6,586,317 | B1 * | 7/2003 | Vashchenko ...... | H01L 21/82285 257/E21.356 |

(Continued)

*Primary Examiner* — Mohammed Shamsuzzaman
(74) *Attorney, Agent, or Firm* — Innovation Counsel LLP

(57) ABSTRACT

A bidirectional transient voltage suppressor (TVS) circuit for data pins of electronic devices includes two sets of steering diodes and a diode triggered clamp device in some embodiment. In other embodiments, a bidirectional transient voltage suppressor (TVS) circuit for data pins of electronic devices includes two sets of steering diodes with a clamp device merged with a steering diode in each set. The TVS circuit is constructed to realize low capacitance at the protected nodes and improved clamping voltage for robust protection against surge evens. In some embodiments, the TVS circuit realizes low capacitance at the protected nodes by fully or almost completely depleting the P-N junction connected to the protected nodes in the operating voltage range. In this manner, the TVS circuit does not present undesirable parasitic capacitance to the data pins being protected, especially when the data pins are applied in high speed applications.

10 Claims, 8 Drawing Sheets

(56) References Cited

U.S. PATENT DOCUMENTS

| | | | |
|---|---|---|---|
| 7,538,997 B2 | 5/2009 | Mallikararjunaswamy | |
| 7,554,839 B2 | 6/2009 | Bobde | |
| 7,781,826 B2 | 8/2010 | Mallikararjunaswamy et al. | |
| 7,795,987 B2 | 9/2010 | Bobde | |
| 7,863,995 B2 | 1/2011 | Ho et al. | |
| 7,880,223 B2 | 2/2011 | Bobde | |
| 8,218,276 B2 | 7/2012 | Mallikararjunaswamy | |
| 8,338,854 B2 | 12/2012 | Bobde et al. | |
| 8,338,915 B2 | 12/2012 | Mallikararjunaswamy et al. | |
| 8,698,196 B2 | 4/2014 | Guan et al. | |
| 8,785,971 B2 * | 7/2014 | Chuang | H01L 27/0296 257/106 |
| 9,705,026 B2 * | 7/2017 | Willemen | H01L 27/0255 |
| 9,774,206 B2 * | 9/2017 | Kim | H02J 7/0016 |
| 2008/0048215 A1 * | 2/2008 | Davies | H01L 27/0262 257/274 |
| 2010/0244090 A1 * | 9/2010 | Bobde | H01L 27/0259 257/112 |
| 2011/0212595 A1 * | 9/2011 | Hu | H01L 21/761 438/430 |
| 2012/0091504 A1 * | 4/2012 | Davis | H01L 27/0255 257/146 |
| 2012/0293904 A1 * | 11/2012 | Salcedo | H02H 9/046 361/111 |
| 2014/0138735 A1 * | 5/2014 | Clarke | H01L 29/0692 257/124 |
| 2014/0167099 A1 * | 6/2014 | Mergens | H01L 27/0262 257/109 |
| 2015/0123240 A1 * | 5/2015 | Bowman | H01L 29/0688 257/506 |
| 2017/0084601 A1 * | 3/2017 | Yao | H01L 27/0255 |
| 2017/0317070 A1 * | 11/2017 | Salcedo | H01L 24/49 |

* cited by examiner

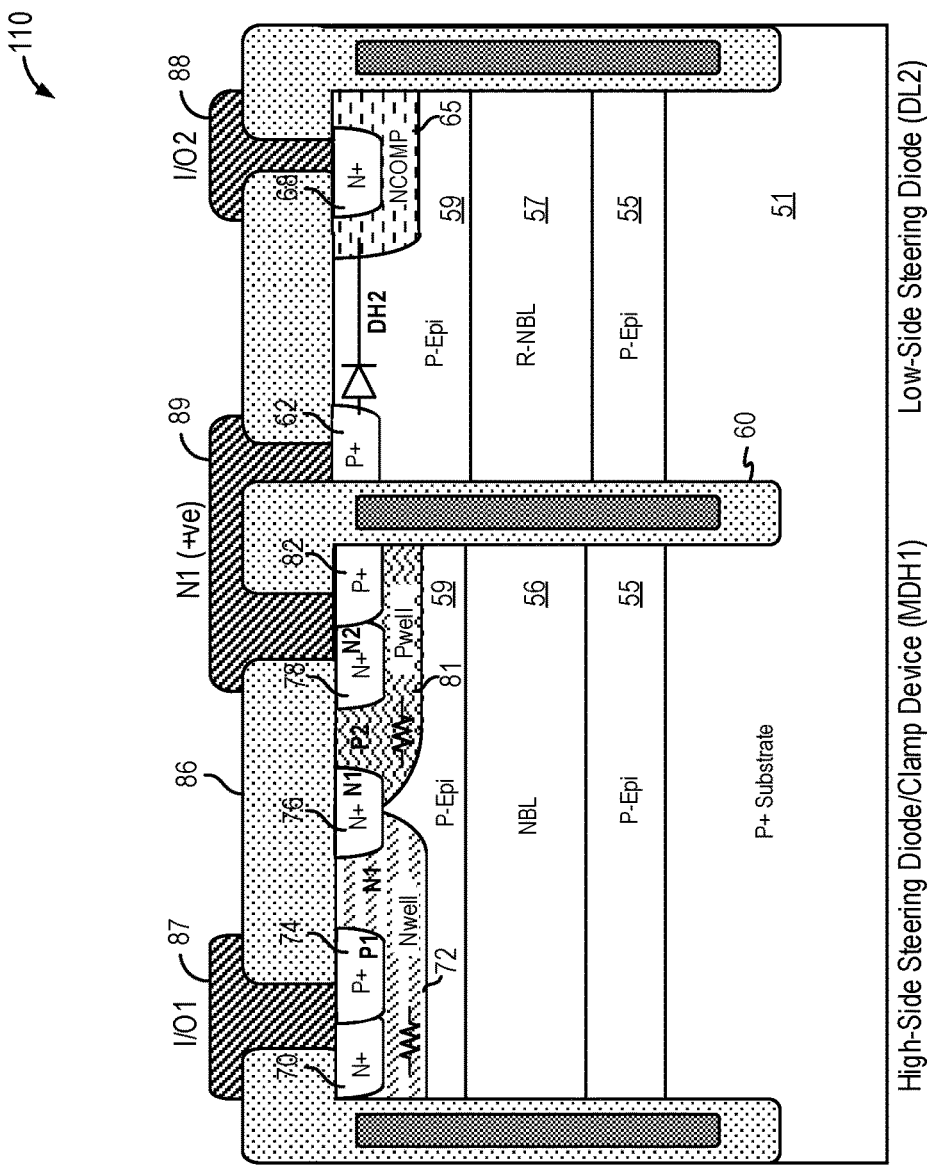
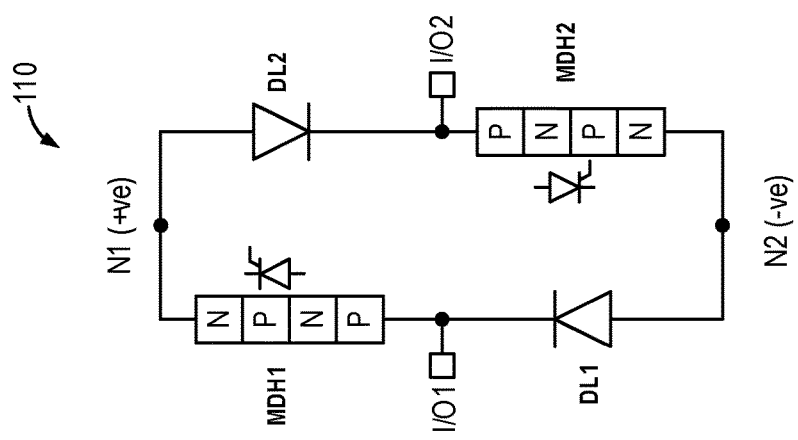
Fig. 7
Fig. 7a

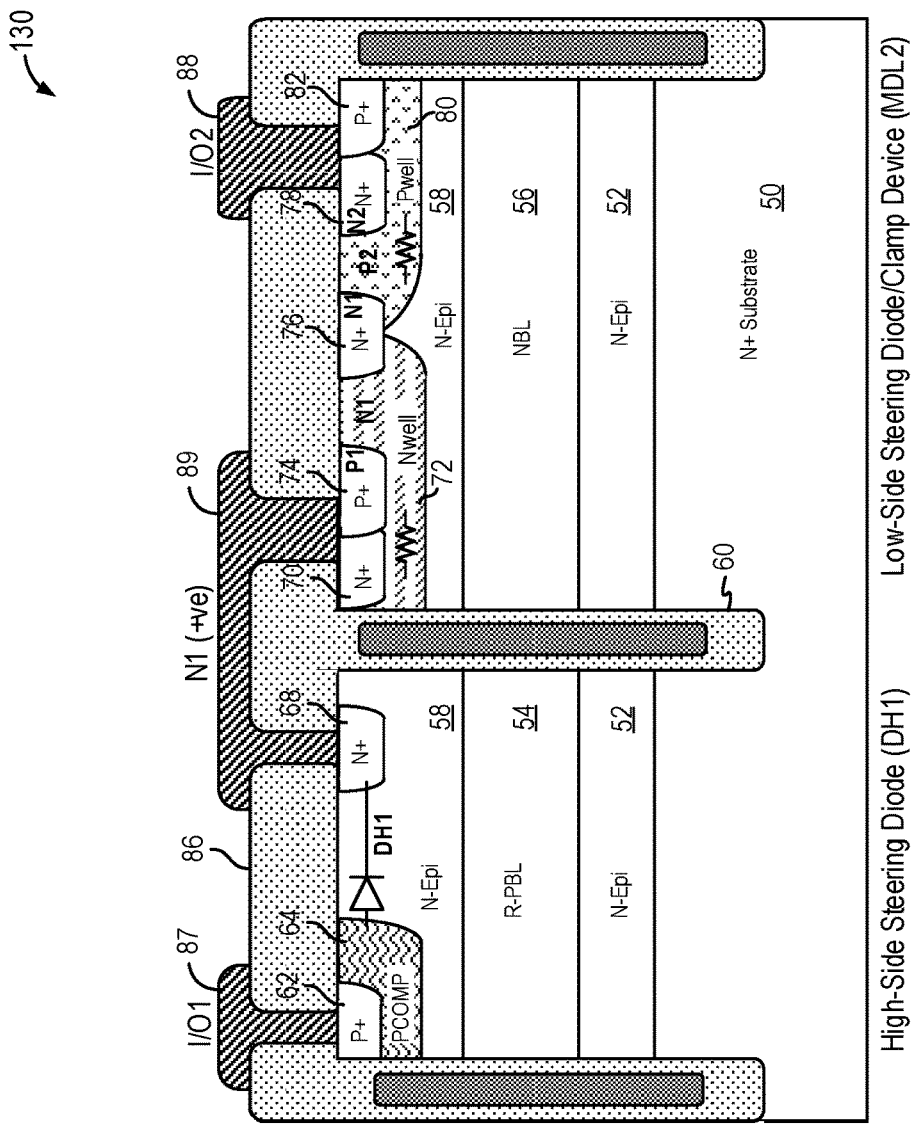
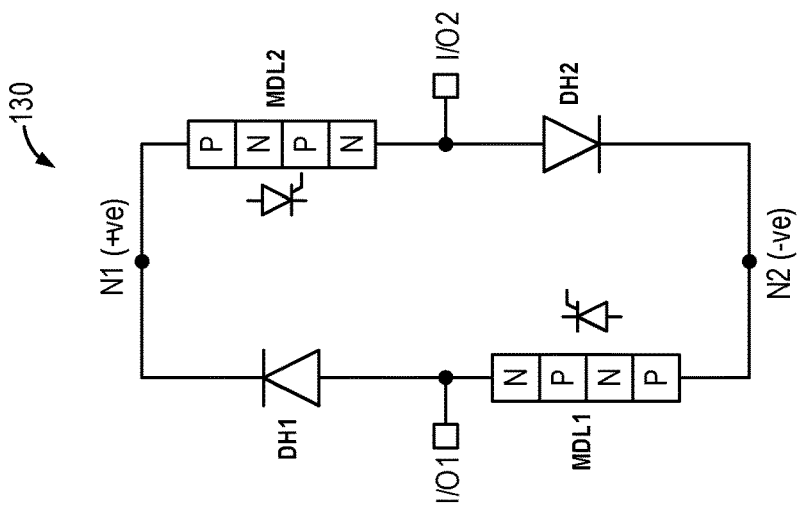
Fig. 9
Fig. 9a

LOW CAPACITANCE BIDIRECTIONAL TRANSIENT VOLTAGE SUPPRESSOR

CROSS REFERENCE TO OTHER APPLICATIONS

This application is a continuation of U.S. patent application Ser. No. 15/605,662, entitled LOW CAPACITANCE BIDIRECTIONAL TRANSIENT VOLTAGE SUPPRESSOR, filed May 25, 2017, now U.S. Pat. No. 10,062,682, issued Aug. 28, 2018, which is incorporated herein by reference for all purposes.

BACKGROUND OF THE INVENTION

Voltages and current transients are major causes of integrated circuit failure in electronic systems. Transients are generated from a variety of sources both internal and external to the system. For instance, common sources of transients include normal switching operations of power supplies, AC line fluctuations, lightning surges, and electrostatic discharge (ESD).

Transient voltage suppressors (TVS) are commonly employed for protecting integrated circuits from damages due to the occurrences of transients or over-voltage conditions at the integrated circuit. Over-voltage protection are important for consumer devices or the Internet of Things devices as these electronic devices are exposed to frequent human handling and, as a result, may be susceptible to ESD or transient voltage events that may damage the devices.

In particular, the power supply pins and the data pins of the electronic devices both require protection from over-voltages conditions due to ESD events or switching and lightning transient events. Typically, the power supply pins need high surge protection but can tolerate protection devices with higher capacitance. Meanwhile, the data pins, which may operate at high data speed, requires protection devices that provide surge protection with low capacitance so as not to interfere with the data speed of the protected data pins.

Existing TVS protection solution applied to input/output (I/O) terminals in high speed applications exist both in vertical and lateral type of semiconductor circuit structures. In conventional vertical unidirectional structures, the I/O current during ESD flows from high side and low side steering diode vertically to ground. However, when these vertical structures are used for bidirectional TVS, the I/O current flows vertically and then laterally to ground via the second I/O terminal. Due to the lateral current flow, the parasitic resistance between vertical and lateral current flow path increases which degrades the clamping voltage.

BRIEF DESCRIPTION OF THE DRAWINGS

Various embodiments of the invention are disclosed in the following detailed description and the accompanying drawings.

FIG. 7, which includes FIG. 7a, is a cross-sectional view of a part of the TVS circuit using a merged diode/clamp device structure in alternate embodiments of the present invention.

FIG. 9, which includes FIG. 9a, is a cross-sectional view of a part of the TVS circuit using a merged diode/clamp device structure in alternate embodiments of the present invention.

DETAILED DESCRIPTION

Figure 1:
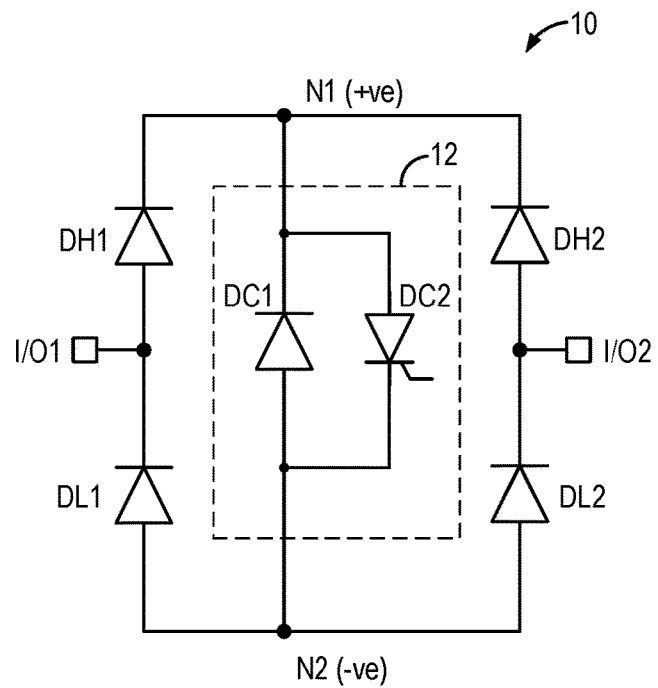
FIG. 1 is a circuit diagram of a bidirectional TVS protection circuit in some embodiments of the present invention.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a bidirectional transient voltage suppressor (TVS) circuit includes two sets of steering diodes and a diode triggered clamp device. In other embodiments of the present invention, a bidirectional transient voltage suppressor (TVS) circuit includes two sets of steering diodes with a clamp device merged with a steering diode in each set. The bidirectional TVS circuit of the present invention is constructed to realize low capacitance at the protected nodes during the blocking mode and realize improved clamping voltage for robust protection against over-voltage transient events. More specifically, in some embodiments, the TVS circuit realizes low capacitance at the protected nodes by fully or almost completely depleting the P-N junction connected to the protected nodes in the operating voltage range of the protected nodes. In this manner, the TVS circuit does not present undesirable parasitic capacitance to data pins being protected, especially when the data pins are used in high speed applications.

In the present description, a transient voltage suppressor (TVS) circuit refers to a protection circuit to protect a protected node from over-voltage transient conditions, such as voltage surges or voltage spikes. The TVS circuit operates by shunting the excess current from the protected node when a surge voltage exceeding the breakdown voltage of the TVS circuit is applied to the protected node. The TVS circuit includes a clamp device for clamping the voltage at the protected node at a clamping voltage much lower than the voltage value of the voltage surge while conducting the surge current. A TVS circuit can be either a unidirectional device or a bidirectional device. A unidirectional TVS has an asymmetrical current-voltage characteristic and is typically used for protecting circuit nodes whose signals are unidirectional—that is, the signals are always above or below a certain reference voltage, such as ground. For example, a unidirectional TVS may be used to protect a circuit node whose normal signal is a positive voltage from 0V to 5V.

On the other hand, a bidirectional TVS has a symmetrical current-voltage characteristics and is typically used for protecting circuit nodes whose signals are bidirectional or can have voltage levels both above and below the reference voltage, such as ground. For example, a bidirectional TVS may be used to protect a circuit node whose normal signal varies symmetrically above and below ground, such as from −12V to 12V. In this case, the bidirectional TVS protects the circuit node from a surge voltage that goes below −12 V or above 12V.

In operation, the TVS circuit is in a blocking mode and is non-conductive except for possible leakage current when the voltage at the protected node is below the breakdown voltage of the TVS circuit, sometimes referred to as a reverse standoff voltage. That is, when the voltage at the protected node is within the normal voltage range for the protected node, the TVS circuit is non-conductive and is in blocking mode. However, during the blocking mode, the TVS circuit presents a capacitance to the protected node. When the protected node is associated with a high speed data pin, the capacitance of the TVS circuit in the blocking mode or non-conductive mode should be low so as not to impede the high speed operation of the data pin.

In some embodiments, the bidirectional TVS circuit of the present invention realizes a low capacitance value of less than 0.2 pf in the blocking mode. The low capacitance TVS circuit of the present invention can be advantageously applied to protect high-speed data pins or input-output (I/O) terminals in high speed electronic applications, such as data pins in USB3.1 data bus, HDMI-2.0 data bus, or V by One cables.

The bidirectional TVS circuit of the present invention realizes many advantages over conventional TVS circuits. First, the TVS circuit of the present invention is constructed to ensure that the current path of the surge current flows in the lateral direction only through the semiconductor device structure of the TVS circuit. The lateral current flow improves the clamping voltage of the TVS circuit by reducing the resistance in the current path. For bi-directional TVS circuits, the TVS circuit of the present invention with lateral current flow realizes reduced resistance as compared to a vertical TVS structure or a TVS circuit with a vertical current flow. Second, the breakdown voltage of the TVS circuit can be tailored to a desired value by adjusting the junction breakdown voltage of the clamp device, or adjusting the threshold voltage of the MOSFET device in the clamp circuit, or by using a dv/dt trigger. In some embodiments, the TVS circuit can optimize the capacitance versus clamping voltage trade-off by adjusting the spacing between the anode and cathode regions of the clamp device. Third, in some embodiment, the reverse standoff voltage—or the holding voltage—of the TVS circuit can be adjusted by varying the emitter to base resistance of bipolar transistors forming the clamp device.

FIG. 1 is a circuit diagram of a bidirectional TVS protection circuit in embodiments of the present invention. Referring to FIG. 1, a TVS circuit 10 includes two sets of steering diodes coupled to provide surge protection for two input-output (I/O) terminals I/O1 and I/O2. Each set of steering diodes include a high-side steering diode and a low-side steering diode. More specifically, a high-side steering diode DH1 and a low-side steering diode DL1 are coupled to the I/O terminal I/O1 as the protected node. Meanwhile, a high-side steering diode DH2 and a low-side steering diode DL2 are coupled to the I/O terminal I/O2 as the protected node. The I/O terminal I/O1 is connected to the anode of the high-side steering diode DH1 and to the cathode of the low-side steering diode DL1. Similarly, the I/O terminal I/O2 is connected to the anode of the high-side steering diode DH2 and to the cathode of the low-side steering diode DL2. The cathode terminals of diodes DH1 and DH2 are connected to a node N1. The anode terminals of diodes DL1 and DL2 are connected to a node N2.

The TVS circuit 10 also includes a clamp circuit 12 as the clamp device. The clamp circuit 12 includes a diode DC1 having a cathode connected to node N1 and an anode connected to node N2 and a silicon controlled rectifier (SCR) DC2 having an anode connected to node N1 and a cathode connected to node N2. The clamp circuit 12 operates to clamp the voltage at nodes N1 and N2 when a zap voltage is applied to the I/O terminals while allowing the zap current to flow through the TVS circuit from one I/O terminal to the other I/O terminal. In the bidirectional TVS circuit 10, the nodes N1 and N2 are floating, that is, nodes N1 and N2 are not electrically connected to or biased to any electrical potential.

In operation, when a positive zap is applied to I/O terminal I/O1 with respect to I/O terminal I/O2, the current flows from terminal I/O1 through diode DH1, SCR DC2, and then diode DL2 into terminal I/O2. Similarly, when a negative zap is applied to I/O terminal I/O1 with respect to I/O terminal I/O2, which is equivalent to a positive zap on terminal I/O2 with respect to terminal I/O1, the current flows from terminal I/O2 through diode DH2, SCR DC2, and then diode DL1 and into terminal I/O1.

In other words, a positive zap voltage applied to either of the I/O terminals will forward bias the high-side steering diode (DH1 or DH2) of the I/O terminal being zapped and when the zap voltage reaches or exceeds the breakdown voltage (BV) of the clamp circuit 12, the zap current trigger the SCR DC2 and the SCR turns on to conduct current. The zap current flows through the node N2 and forward bias the low-side steering diode (DL1 or DL2). The zap current then exits through the other I/O terminal. Thus, the node N1 will be more positively biased relative to node N2. A negative zap voltage applied to either of the I/O terminals will result in the same current conduction operation as if a positive zap voltage is applied to the other I/O terminal.

Figure 2:
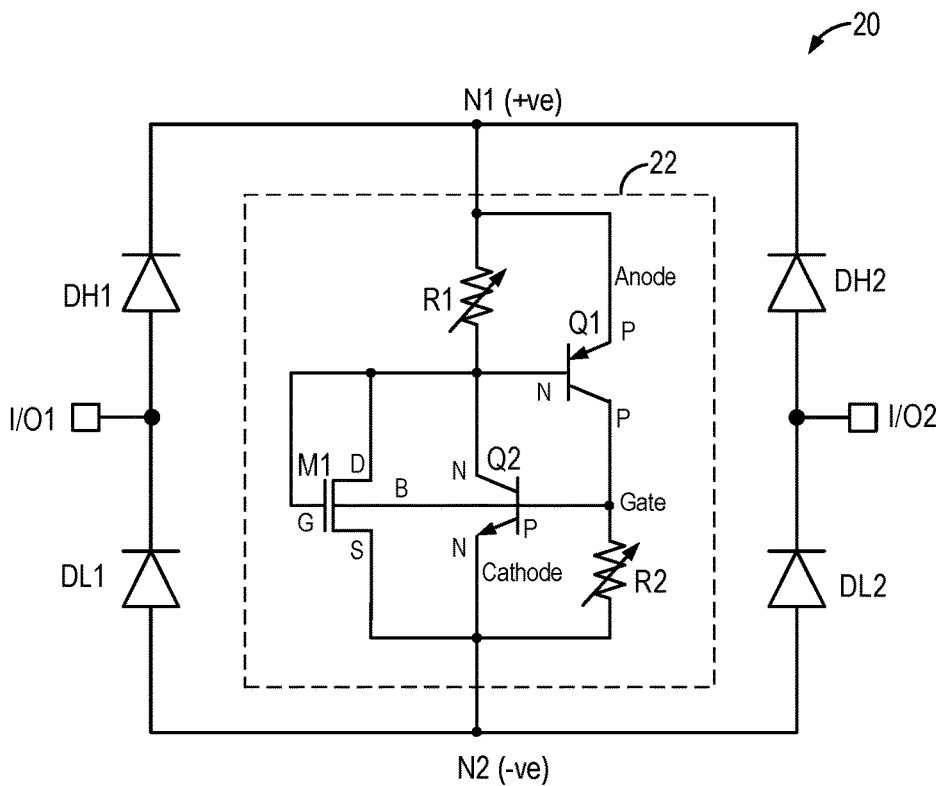
FIG. 2 is a circuit diagram of a bidirectional TVS protection circuit in embodiments of the present invention.

FIG. 2 is a circuit diagram of a bidirectional TVS protection circuit in embodiments of the present invention. In particular, FIG. 2 illustrates the construction of the clamp circuit in the TVS circuit of claim 1 in some embodiments. Referring to FIG. 2, the TVS circuit 20 includes two sets of steering diodes coupled to provide surge protection for two input-output (I/O) terminals I/O1 and I/O2, in the same manner as the TVS circuit 10 of FIG. 1. In TVS circuit 20, the clamp circuit 22 is formed by a diode-connected NMOS transistor M1 and a SCR formed by a PNP bipolar transistor Q1 and an NPN bipolar transistor Q2.

In operation, when a positive zap is applied to I/O terminal I/O1 with respect to I/O terminal I/O2, the current flows from terminal I/O1 through diode DH1, resistor R1, MOS transistor M1, and then diode DL2 into terminal I/O2. As the zap voltage increases on terminal I/O1, the current flowing in the aforementioned current path increases resulting in an increase in the voltage drop across resistor R1. When the voltage drop across resistor R1 reaches about 0.7V which is enough to forward bias the emitter-base junction of the PNP bipolar transistor Q1, then transistor Q1 will enter into forward conduction and the current flowing through R2 will increase. When the voltage potential across resistor R2 reaches 0.7V, then the emitter-base junction of the NPN bipolar transistor Q2 will be forward biased and at this point the SCR formed by transistors Q1 and Q2 will be triggered and the SCR will conduct all the current from node N1 to node N2 through the bipolar transistors Q1 and Q2.

Similarly, when a negative zap is applied to I/O terminal I/O1 with respect to I/O terminal I/O2, which is equivalent to a positive zap on terminal I/O2 with respect to terminal I/O1, the current flows from terminal I/O2 through diode DH2, into resistor R1, MOS transistor M1 and then diode DL1 and into terminal I/O1. When the voltage potential across resistors R1 and R2 both reach 0.7V, as in the case of the positive zap described above, then the SCR will turn on and conduct all current from N1 to N2.

Figure 3:
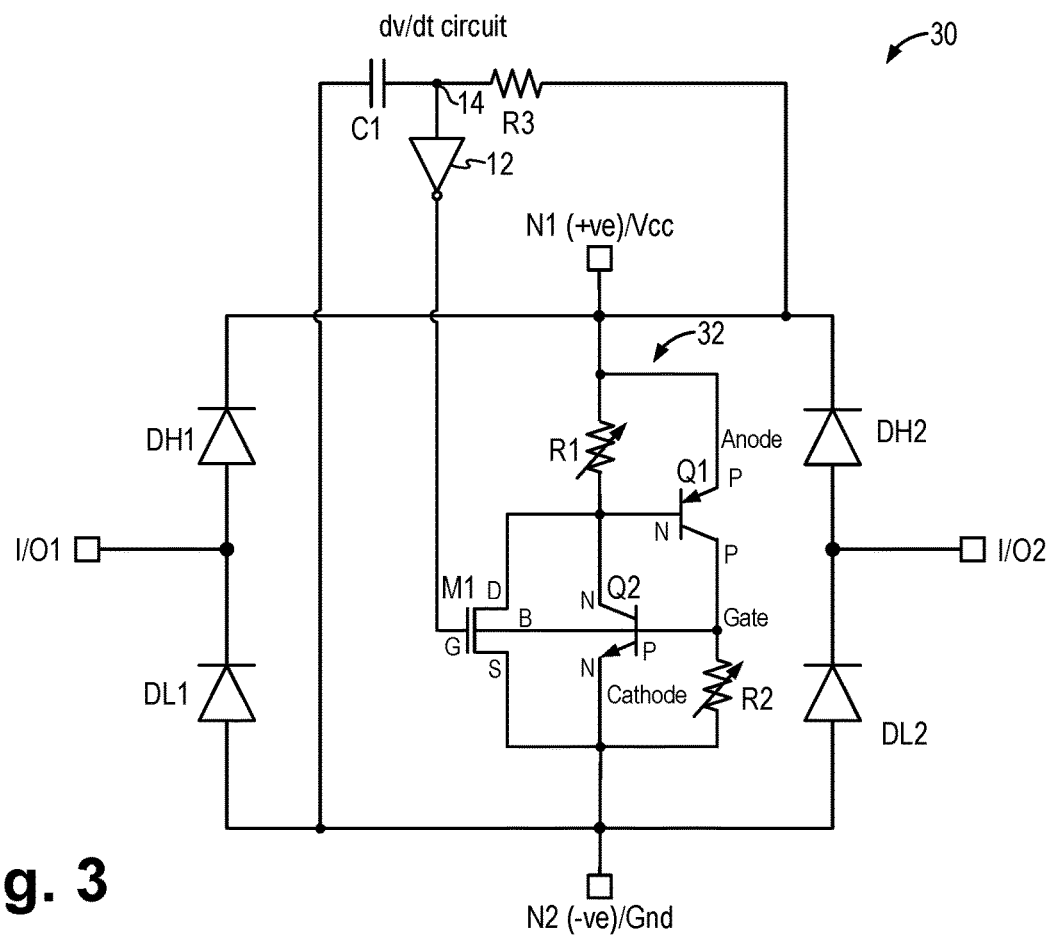
FIG. 3 is a circuit diagram of a bidirectional TVS protection circuit in embodiments of the present invention.

FIG. 3 is a circuit diagram of a bidirectional TVS protection circuit in embodiments of the present invention. In particular, the TVS circuit 30 of FIG. 3 is constructed in the same manner as the TVS circuit 20 of FIG. 2 except for the clamp circuit 32. Referring to FIG. 3, instead of using a diode-connected MOS transistor, the clamp circuit 32 in TVS circuit 30 uses an NMOS transistor M1 that is driven by a dv/dt trigger circuit. The dv/dt trigger circuit includes a capacitor C1 connected to node N2 and a common node 14 and a resistor R3 connected between node N1 and the common node 14. An inverter 12 inverts the state of the drive signal coupled to the gate terminal of the NMOS transistor M1.

When the TVS circuit 30 is configured for bidirectional operation, the N1 and N2 nodes are floating. When either the I/O terminal I/O1 or I/O2 is zapped, node N1 will get biased positive relative to node N2 and the dv/dt circuit will operate to trigger the clamp circuit 32 to clamp the voltage across nodes N1 and N2. Alternately, the TVS circuit 30 can be configured for unidirectional operation. In unidirectional operation, the TVS circuit 30 may be applied to a system including an array of I/O terminals and power supply pins—that is, the Vcc and ground pins. In that case, the node N1 will be coupled to the positive power supply Vcc and the node N2 will be coupled to ground and the TVS circuit 30 will operate to provide surge protection to the I/O terminals connected thereto.

Figure 4:
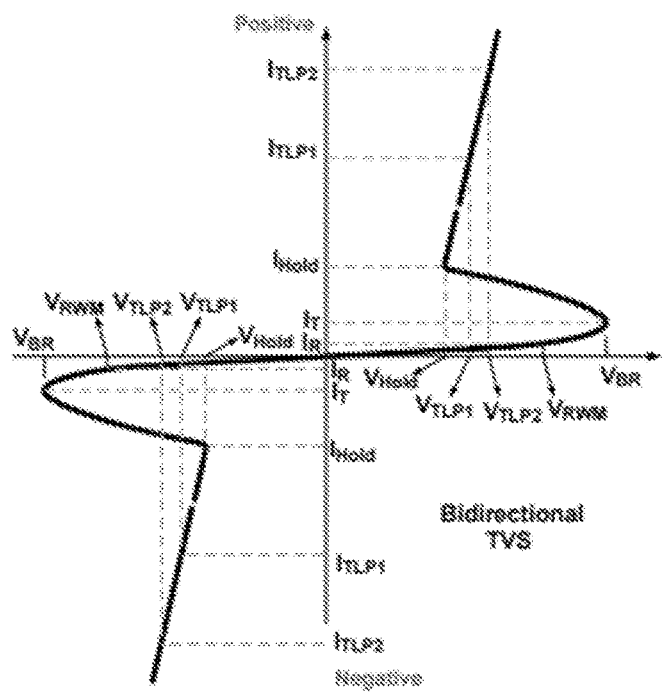
FIG. 4 illustrates the current-voltage characteristics of the bidirectional TVS circuit in embodiments of the present invention.

FIG. 4 illustrates the current-voltage characteristics of the bidirectional TVS circuit in embodiments of the present invention. Referring to FIG. 4, the TVS circuit of the present invention realizes a symmetrical current-voltage characteristics to provide bi-directional protection to a circuit node. The TVS circuit provides blocking when the voltage level at the I/O terminal is below the operating voltage $V_{RWM}$, for either positive or negative voltage polarity. The TVS circuit has very little leakage current in the blocking mode. When a voltage exceeding the breakdown voltage $V_{BR}$ of the TVS circuit is applied, the TVS circuit is triggered and the TVS circuit will snap back. The clamp circuit will clamp the voltage at the protected node (the I/O terminal) at the holding voltage ($V_{Hold}$). Zap current flows with the voltage being held at the holding voltage until the surge event is dissipated. As thus constructed, the TVS circuit of the present invention realizes bidirectional clamping with symmetrical current-voltage characteristics for positive or negative zap voltages.

Figures 5, 5A:
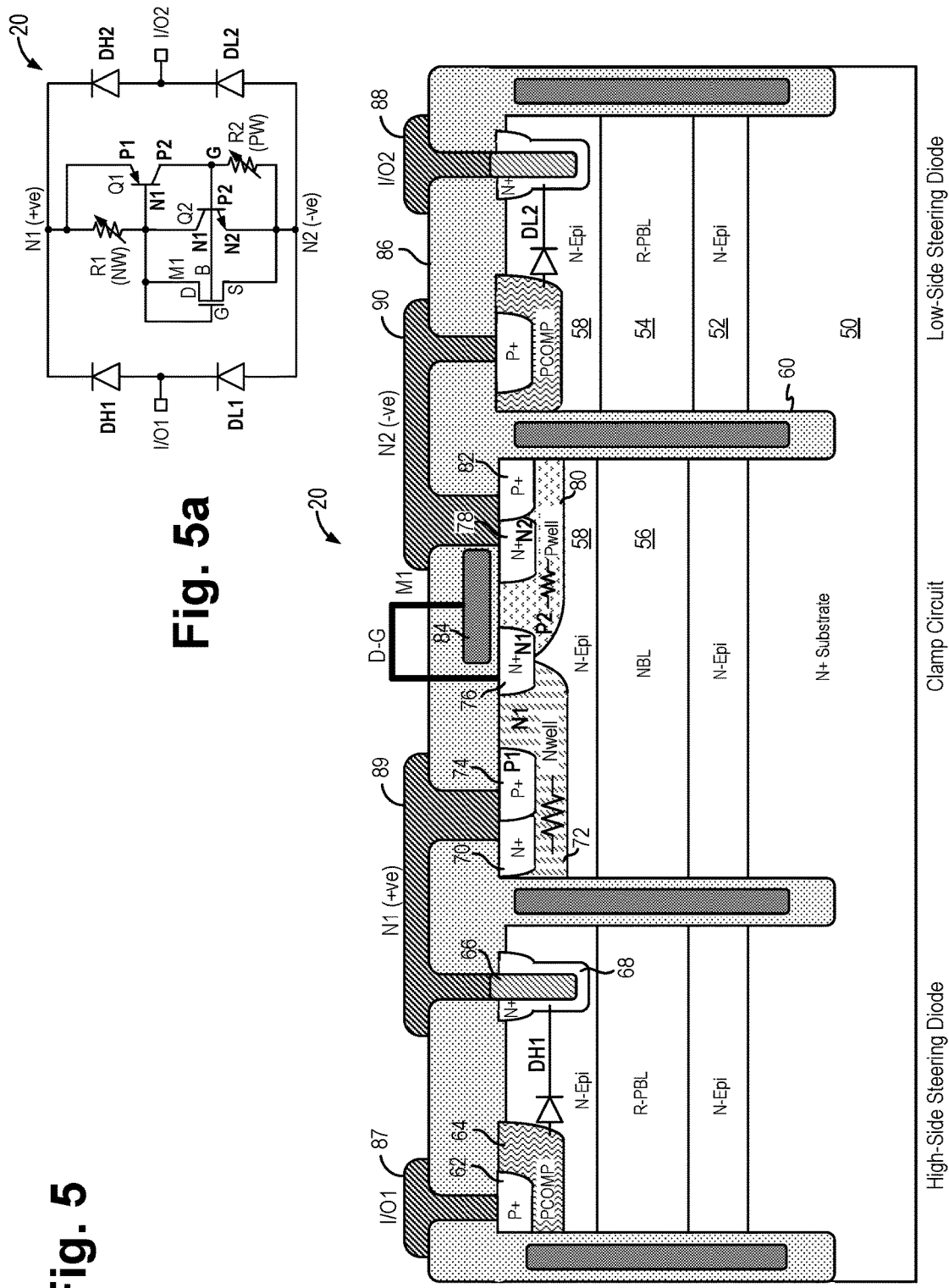
FIG. 5, which includes
FIG. 5a, is a cross-sectional view of a part of the TVS circuit of FIG. 2 in embodiments of the present invention.

FIG. 5, which includes FIG. 5a, is a cross-sectional view of a part of the TVS circuit of FIG. 2 in embodiments of the present invention. The circuit diagram of the TVS circuit 20 of FIG. 2 is reproduced as FIG. 5a in FIG. 5. The cross-section of FIG. 5 illustrates circuit elements of the TVS circuit 20 including the high-side steering diode DH1, the clamp device 22 and the low-side steering diode DL2. Referring to FIG. 5, the TVS circuit 20 is fabricated on an N+ substrate 50. In the present embodiment, an N-type epitaxial layer 52 is formed on the N+ substrate 50. In alternate embodiments, a P-type epitaxial layer can be formed on the N+ substrate 50 instead. Then, N-type buried layer (NBL) 56 and P-type buried layer 54 are selectively formed on the N-type epitaxial layer 52. In the present embodiment, the P-type buried layer 54 is formed as a Resurf P-type buried layer (R-PBL) having a lower doping level than a conventional P-type buried layer. Then a second N-type epitaxial layer 58 is formed on the N and P-type buried layers. The semiconductor structure for forming the TVS circuit is thus constructed.

In the present embodiment, trench isolation structures 60 are used to define and isolate regions of the semiconductor structure for forming the separate circuit elements. In the present embodiment, the trench isolation structures 60 are formed as oxide lined trenches filled with a polysilicon layer and the trenches extend to the N+ substrate 50. In other embodiments, the trench isolation structures 60 can be formed as oxide filled trenches. Furthermore, in some embodiments, when the epitaxial layer formed on the N+ substrate 50 is N-type, the trench isolation structures can extend only up to the N-type epitaxial layer 52. In alternate embodiments, when the epitaxial layer formed on the N+ substrate 50 is a P-type epitaxial, the trench isolation structures will extend into the N+ substrate 50.

With the trench isolation structures 60 thus formed, regions in the semiconductor structure for forming the high-side steering diode, the clamp device and the low-side steering diode are defined. In the present embodiment, the high-side steering diode and the low-side steering are formed using the same diode device structure. In particular, the steering diode is formed as a PN junction diode with the anode formed by a P-type region 64 and the cathode formed by the N-type epitaxial layer 58. In the present embodiment, the P-type region 64 is formed using the doping level typically used for a P-type compensation region and is therefore referred to as the PCOMP region 64. The doping level of the PCOMP region 64 is higher than the doping level of the N-type epitaxial layer 58 but is lower than the heavily doped P+ region 62 used to make ohmic contact to the PCOMP region 64. In one example, the doping level of the PCOMP region 64 is between from $1 \times 10^{13}$ cm$^{-3}$ to $1 \times 10^{15}$ cm$^{-3}$ and is a lower doping level in comparison to the doping level of the P-well 80 which is about $1 \times 10^{16}$ cm$^{-3}$ to $5 \times 10^{16}$ cm$^{-3}$. A metal contact 87 is made in the dielectric layer 86 to the P+ region 62 to form the anode terminal. Meanwhile, an N+ tungsten plug structure is used to make the ohmic contact to the N-type epitaxial layer 58 as the cathode terminal. In particular, a shallow trench is formed in the N-epitaxial layer 58 and a heavily doped N+ region 68 is formed around the shallow trench. The trench is then filled with tungsten 66. A metal contact 89 is made to the tungsten plug to form the cathode terminal.

For the high-side steering diode DH1, the anode terminal 87 is connected to the I/O terminal I/O1 and the cathode terminal 90 is connected to node N1. For the low-side steering diode DL2, the anode terminal 90 is connected to node N2 and the cathode terminal 88 is connected to I/O terminal I/O2. The high-side steering diode DH1 and the low-side steering diode DL2 are thus formed on the semiconductor structure.

The clamp device or clamp circuit of the TVS circuit 20 is formed as diode-triggered SCR between the two steering diodes. In particular, the NMOS transistor M1 is formed by an N+ drain region 76 and an N+ source region 78 formed in a P-well 80. A polysilicon gate 84 is formed above the channel region between the drain and source regions and is insulated from the semiconductor layer (P-well 80 in N-Epitaxial 58) by a gate oxide layer. The gate 84 and the drain region 76 are electrically shorted together so that the NMOS transistor M1 functions as a diode-connected MOS transistor.

The N+ drain region 76 is physically and electrically connected to an N-well region (NW) 72 formed adjacent to the N+ drain region. The N+ drain region 76 is therefore electrically connected to the node N1 through the N-well region 72 and a heavily doped N+ contact region 70. The N+ contact region 70 is connected to the cathode terminal 66 of the high-side steering diode DH1 by the metal contact 89. The N-well region 72 provides a resistance between the drain region of transistor M1 and the node N1, as depicted as the resistor R1 in the clamp circuit 20. In one example, the doping level of the N-well region 72 is about $1 \times 10^{16}$ cm$^{-3}$ to $5 \times 10^{16}$ cm$^{-3}$.

Meanwhile, the P-well 80 is electrically connected to the node N2 through a heavily doped P+ contact region 82. A metal contact 90 connects the P-well 80 to the node N2 and to the anode terminal (PCOMP) of the low-side steering diode DL2. The P-well 80 provides a resistance between the body region of transistor M1 and the node N2, as depicted as the resistor R2 in the clamp circuit 20. In one example, the P-well 80 has a doping level about $1 \times 10^{16}$ cm$^{-3}$ to $5 \times 10^{16}$ cm$^{-3}$. The N-well resistance (R1) and the P-well resistance (R2) can be modified or adjusted by adjusting the doping levels or the length of the well regions to adjust the resistance values.

The clamp circuit 20 further includes an integrated SCR device formed by heavily doped P+ region 74 and parasitic structures within NMOS transistor M1. In particular, a PNP bipolar transistor Q1 is formed by P+ region 74 as the emitter, N-well region 72 as the base, and P-well 80 as the collector. An NPN bipolar transistor Q2 is formed by N-well region 72 as the collector, P-well 80 as the base and N+ region 78 as the emitter. The base of the PNP transistor Q1 is the same as the collector of the NPN transistor Q2 and the base of the NPN transistor Q2 is the same as the collector of the PNP transistor Q1. As thus configured, a SCR is formed with the P+ region 74 as the anode and the N+ region 78 as the cathode and the P-well 80 as the control terminal of the SCR. The SCR conduction is triggered by the diode-connected NMOS transistor M1 which is connected across the base of PNP transistor Q1 and the emitter of NPN transistor Q2. Once the SCR is triggered to conduct, the conduction is self-sustained without the biasing provided by the diode-connected NMOS transistor M1.

The TVS circuit as thus constructed realizes many advantages. First, the current path of the surge current from one I/O terminal (e.g., I/O1) to the other I/O terminal (e.g., I/O2) is primarily in the lateral direction. The lateral current path for the surge current reduces undesirable parasitic resistance and improves the clamping voltage characteristics. Furthermore, the cathode of the steering diodes is formed using a trench N+ region which further improves clamping.

Second, the trigger voltage of the clamp circuit is determined by the threshold voltage $V_T$ of the NMOS transistor M1. That is, when the gate-to-source voltage at the NMOS transistor M1 reaches the threshold voltage $V_T$, the diode-connected NMOS M1 will conduct with current flow between the N+ drain 76 and N+ emitter/source 78. The current flow forms a base current flowing into PNP transistor Q1 which will trigger the SCR action. Once the SCR action is triggered, the SCR will snap back and hold the voltage across nodes N1 and N2 at the holding voltage (FIG. 4) while continually conduct the surge current. Accordingly, the trigger voltage of the TVS circuit is determined by the threshold voltage of the NMOS transistor M1. The NMOS transistor M1 further provides dv/dt control.

In one example, the threshold voltage of the NMOS transistor M1 is 3V and the steering diode has a forward bias voltage drop of 0.7V. When a positive zap is applied to I/O terminal I/O1, the anode 64 (P+ 62/PCOMP 64) is biased positive relative to node N1 and the high-side steering diode DH1 is forward biased and current flows from the diode to node N1. When the voltage at node N1 increases to a voltage of the forward bias voltage drop (e.g. 0.7V) of the diode DH1 plus the threshold voltage $V_T$ (e.g. 3V) of the NMOS transistor M1, the NMOS transistor M1 is turned on and current will flow through the clamp device to the low-side steering diode DL2. The low-side steering diode is forward biased and current flow from node N2 (anode) to the I/O terminal I/O2 (cathode) with another forward bias voltage drop (0.7V) at the diode DL2. Thus, the TVS circuit 20 of FIG. 5 will be triggered to conduct current from terminal I/O1 to terminal I/O2 when a surge voltage applied to the I/O terminal exceeds the threshold voltage of the NMOS transistor plus two forward biased diode voltage drop, that is, $V_T$+2FB. In the present example, the TVS circuit 20 will be triggered at a voltage of 3V+2*0.7V=4.4V.

Third, a salient characteristic of the steering diode structure used herein is that the PN junction of the steering diode is completely depleted at a bias voltage of 0V. Thus, the vertical parasitic capacitance at the I/O terminal is substantially eliminated and the TVS circuit presents very low capacitance to the I/O terminal. In particular, the N-epitaxial layers 52, 58 and the R-PBL layer 54 are completely depleted to form a long vertical depletion region from the anode terminal 87 to the N+ substrate 50 of the semiconductor structure. In this manner, the parasitic capacitance as seen by the I/O terminal is substantially reduced. The TVS circuit 20 thus provides surge protection with low capacitance and low leakage during blocking mode at the input-output terminals.

In the present embodiment, the lightly doped PCOMP region 64 is used to enhance the depletion from the top surface of the semiconductor structure at 0V bias voltage. As it is well understood, a depletion region extends further in a lightly doped region than a heavily doped region. Thus, by using a more lightly doped P-type region 64 as the anode, it is possible to ensure that the entire vertical region of the PN junction is depleted to cut down on the parasitic capacitance. In other embodiments, the PCOMP region 64 may be omitted and the PN junction of N-Epitaxial layer 58 and the R-PBL layer 54 may still be sufficiently depleted to cut down the parasitic capacitance.

Figures 6, 6A:
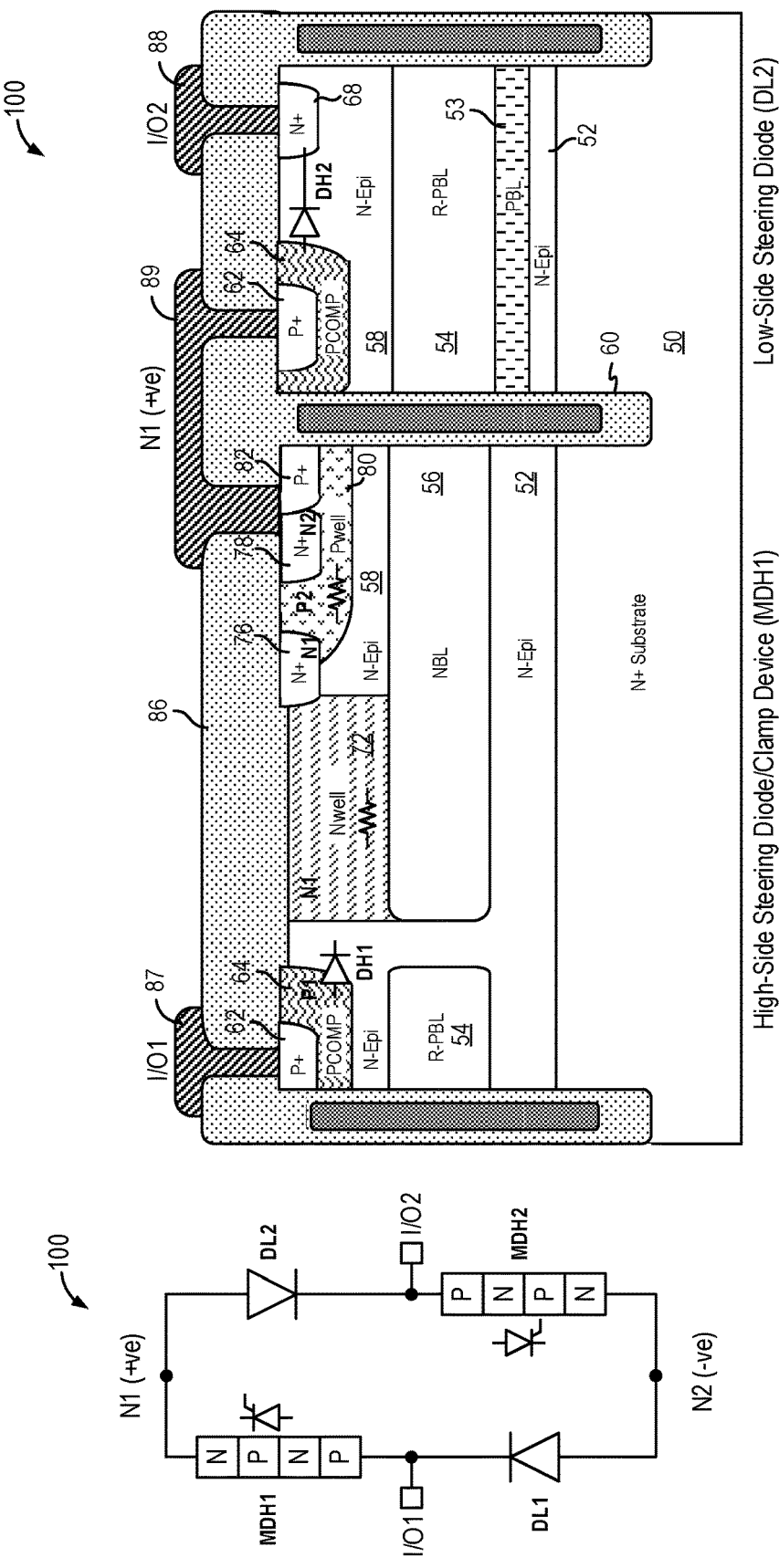
FIG. 6, which includes
FIG. 6a, is a cross-sectional view of a part of the TVS circuit using a merged diode/clamp device structure in embodiments of the present invention.

In the semiconductor structured used to fabricate the TVS circuit of FIG. 2, the steering diodes and the clamp device are formed separately, each in an active region defined by the trench isolation structures 60. In other embodiments, the TVS circuit can be reduced in size by merging the clamp device with one of the steering diode. FIG. 6, which includes FIG. 6a, is a cross-sectional view of a part of the TVS circuit using a merged diode/clamp device structure in embodiments of the present invention. FIG. 6a illustrates the circuit diagram of the TVS circuit 100 using the merged diode/clamp device structure in some embodiments. Referring to FIG. 6a, the TVS circuit 100 includes two sets of steering diode and merged device coupled to provide surge protection for two input-output (I/O) terminals I/O1 and I/O2. More specifically, the high-side steering diode for I/O terminal I/O1 and the high-side steering diode for the I/O terminal I/O2 are each formed using a merged diode-clamp device, denoted as MDH1 and MDH2 respectively. A separate clamp device or clamp circuit is not used. Instead, the clamp device is merged in with one of the steering diodes at each I/O terminal.

The cross-section of FIG. 6 illustrates circuit elements of the TVS circuit 100 including the merged diode-clamp device MDH1 and the high-side steering diode DL2. Like elements in FIGS. 5 and 6 are given like reference numerals. Referring to FIG. 6, the low-side steering diode DL2 of FIG. 6 (and similarly the low-side steering diode DL1) is constructed in a similar manner as the steering diode in the TVS circuit 20 of FIG. 5. In the present embodiment, the diode structure for steering diode DL2 is formed using an N+ region 68 only to make ohmic contact with the cathode region (N-type epitaxial layer 58) to form the cathode terminal. In other embodiments, the N+ trench and tungsten plug structure shown in FIG. 5 can be used instead of the N+ region 68. Furthermore, in the present embodiment, a P-type buried layer 53 is formed in additional to the Resurf P-type buried layer (R-PBL) 54. The P-type buried layer 53 is more heavily doped than the R-PBL layer 54 and extends in the N-type epitaxial layer 52. The P-type buried layer 53 is used to cut down the parasitic NPN transistor gain between the N+ emitter 68, the R-PBL base 54 and the N+ substrate-collector 50. The P-type buried layer 53 increases the base doping of the parasitic NPN transistor thus formed. In some examples, the P-type buried 53 may have a doping level of $1 \times 10^{18}$ cm$^{-3}$. The R-PBL layer 54 can have a doping level 3 to 4 orders lower than the doping of the P-type buried layer 53. In operation, a vertical depletion region is formed from PCOMP region 64 to the N-Epitaxial layer 52 at a bias voltage of 0V to reduce the vertical parasitic capacitance as seen by the I/O terminal I/O2.

In the merged diode/clamp device MDH1, the PN junction for the high-side steering diode is formed by the P-type region 64 (PCOMP) and the N-type epitaxial layer 58. The P-type region 64 or PCOMP is a lightly doped P-type region. The entire vertical junction area from PCOMP region 64 to the N-Epitaxial layer 52 is depleted at 0V bias voltage to reduce the vertical parasitic capacitance as seen by the I/O terminal I/O1. Similar to the diode structure in FIG. 5, the PCOMP region 64 (as used in diode DL2 or merged diode MDH1) is used to enhance the depletion from the surface of the semiconductor structure at 0V bias voltage. In other embodiments, the PCOMP region 64 can be omitted.

Meanwhile, the clamp device, formed as a SCR, is integrated with the high-side steering diode. In particular, the anode of the SCR is formed by the P+ region 62 with PCOMP region 64 and is detached or separated from the N-well region 72. That is, the anode of the SCR (P+ region 62/PCOMP region 64) is not electrically or physically shorted to the N-well region 72. At a bias voltage of 0V, the PCOMP region 64 will operate to completely deplete the N-well region 72 as well to reduce the parasitic capacitance.

The PNP bipolar transistor Q1 of the SCR is formed by the P+ region 62 (with or without PCOMP region 64) as the emitter, N-well region 72 as the base, and P-well 80 as the collector emitter. The NPN bipolar transistor Q2 of the SCR is formed by N-well region 72 as the collector, P-well 80 as the base and N+ region 78 as the emitter. The base of the PNP transistor Q1 is the same as the collector of the NPN transistor Q2 and the base of the NPN transistor Q2 is the same as the collector of the PNP transistor Q1. As thus configured, a SCR is formed with the P+ region 62 as the anode and the N+ region 78 as the cathode and the P-well 80 as the control terminal of the SCR. The anode of the SCR is electrically connected to the I/O terminal I/O1 through the metal contact 87 and the cathode of the SCR is electrically connected to the node N1 through the metal contact 89. The P-well 80 is electrically connected to the node N1 through the heavily doped P+ contact region 82.

The trigger voltage of the TVS circuit 100 is determined by the breakdown voltage of the N+ region 76 and the P-well 80. When a surge voltage is applied to the I/O terminal I/O1, the high-side steering diode DH1 is forward biased and current flows to the N-well region 72 and to N+ region 76. When sufficient current through N-well region 72 and N+ region 76 to the P-well 80, the PNP transistor Q1 of the SCR is triggered and starts to conduct. Continued current flow will further trigger the NPN transistor Q2 of the SCR to turn on the SCR action to conduct the surge current. The current flow through the merged diode/clamp device MDH1 and the low-side steering diode DL2 is primarily in the lateral direction to ensure low resistance and improved clamping.

In the above-described embodiments, the TVS circuit is fabricated in a semiconductor structure using N+ substrate. In other embodiments, a P+ substrate may be used with corresponding changing to the polarities of other layers. FIG. 7, which includes FIG. 7a, is a cross-sectional view of a part of the TVS circuit using a merged diode/clamp device structure in alternate embodiments of the present invention. The TVS circuit 110 of FIG. 7a is the same as the TVS circuit 100 of FIG. 6a. However, the TVS circuit 110 of FIG. 7 is fabricated on a P+ substrate 51 instead of an N+ substrate used in FIG. 6.

Referring to FIG. 7, the TVS circuit 110 is fabricated on the P+ substrate 51. A P-type epitaxial layer 55 is formed on the P+ substrate 51. Then, N-type buried layer (NBL) 56 and Resurf N-type buried layer (R-NBL) 57 are selectively formed on the P-type epitaxial layer 55. Then, a second P-type epitaxial layer 59 is formed on the N and P-type buried layers. The semiconductor structure for forming the TVS circuit is thus constructed.

In the TVS circuit 110 of FIG. 7, the low-side steering diode DL2 (and similarly for the low-side steering diode DL1) is formed in an active region isolated by trench isolation structures 60. The steering diode is formed as a PN junction diode with the anode formed by the P+ region 74 in the P-Epitaxial layer 59 and the cathode formed by an N-type region 65. A metal contact 89 is made through the dielectric layer 86 to the P+ region 74 to form the anode terminal. In the present embodiment, the N-type region 65 is formed using the doping level typically used for an N-type compensation region and is therefore referred to as the NCOMP region 65. The doping level of the NCOMP region 65 is higher than the doping level of the P-type epitaxial layer 59 but is lower than the heavily doped N+ region 68 used to make ohmic contact to the NCOMP region 65. In one example, the NCOMP region 65 has a doping level of $1\times10^{13}$ cm$^{-3}$ to $1\times10^{15}$ cm$^{-3}$ and the N-well region 72 has a doping level about $1\times10^{16}$ cm$^{-3}$ to $5\times10^{16}$ cm$^{-3}$. A metal contact 88 is made in the dielectric layer 86 to the N+ region 68 to form the cathode terminal. In operation, a vertical depletion region is formed from NCOMP region 65 to the P-Epitaxial layer 55 at a bias voltage of 0V to reduce the vertical parasitic capacitance as seen by the I/O terminal I/O2. The R-NBL layer 57 is completely depleted or partially depleted at the bias voltage of 0V by the NCOMP region 65 due to the higher doping level of the R-NBL layer. Even if the R-NBL layer 57 is only partially depleted, the terminal I/O2 sees two capacitors in series which presents a small capacitance.

In the merged diode/clamp device MDH1, the PN junction for the high-side steering diode is formed by the N-well region 72 and a P-well region 81. The entire vertical junction area from N-well region 72 to the P-Epitaxial layer 55 is depleted at 0V bias voltage to reduce the vertical parasitic capacitance as seen by the I/O terminal I/O1.

Meanwhile, the clamp device, formed as a SCR, is integrated with the high-side steering diode. More specifically, the PNP bipolar transistor Q1 of the SCR is formed by the P+ region 74 as the emitter, N-well region 72 as the base, and P-well region 81 as the collector. The P-well region 81 is more heavily doped than the P-Epitaxial layer 59 but more lightly doped than the P+ region 74. In one example, the P-well region 81 has a doping level about $1\times10^{16}$ cm$^{-3}$ to $5\times10^{16}$ cm$^{-3}$. The NPN bipolar transistor Q2 of the SCR is formed by N-well region 72 as the collector, P-well region 81 as the base and N+ region 78 as the emitter. The base of the PNP transistor Q1 is the same as the collector of the NPN transistor Q2 and the base of the NPN transistor Q2 is the same as the collector of the PNP transistor Q1. As thus configured, a SCR is formed with the P+ region 74 as the anode and the N+ region 78 as the cathode and the P-well region 81 as the control terminal of the SCR. The anode of the SCR is electrically connected to the I/O terminal I/O1 through the metal contact 87 and the cathode of the SCR is electrically connected to the node N1 through the metal contact 89. The P-well region 81 is electrically connected to the node N1 through the heavily doped P+ contact region 82.

Figure 8:
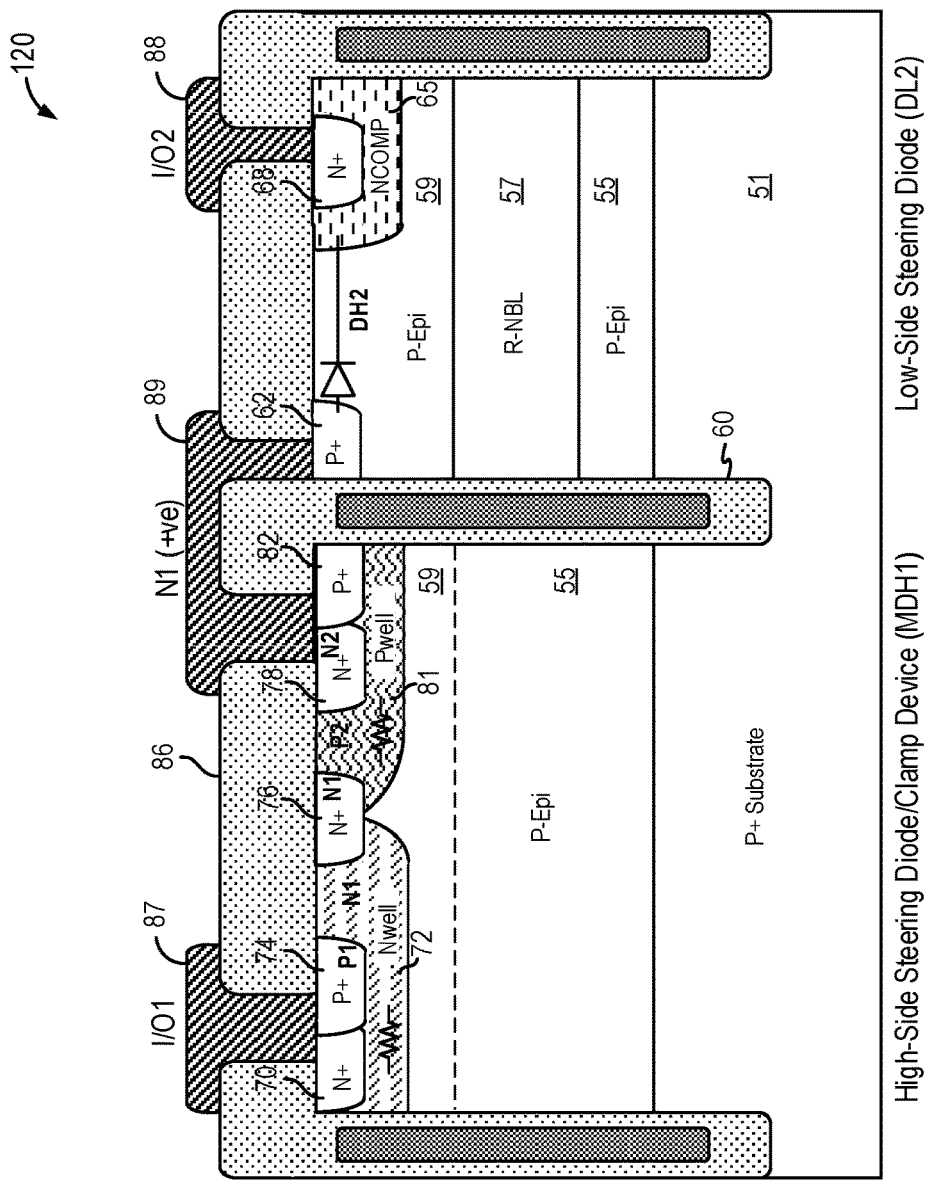
FIG. 8, which includes
Figure 8A:
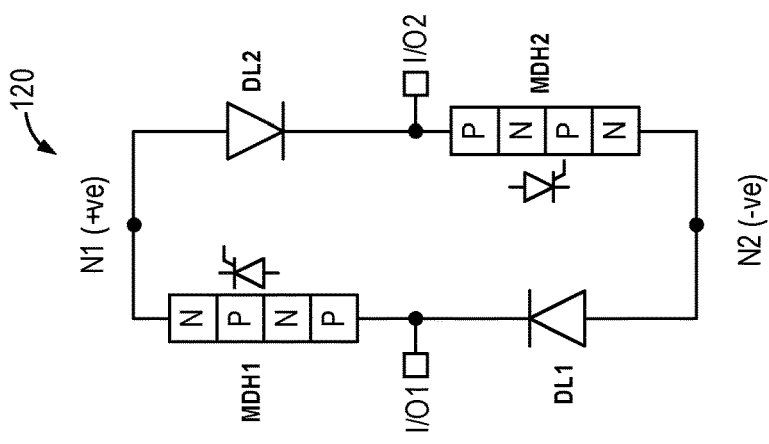
FIG. 8a, is a cross-sectional view of a part of the TVS circuit using a merged diode/clamp device structure in alternate embodiments of the present invention.

In other embodiments, the TVS circuit of FIG. 7 can be made without the N-type buried layer 56. FIG. 8, which includes FIG. 8a, is a cross-sectional view of a part of the TVS circuit using a merged diode/clamp device structure in alternate embodiments of the present invention. The TVS circuit 120 of FIG. 8a is the same as the TVS circuits 100 and 110 of FIGS. 6a and 7a. Referring to FIG. 8, the TVS circuit 120 of FIG. 8 is fabricated in the same manner as the TVS circuit 110 of FIG. 7 except that the N-type buried layer 56 is omitted. In this case, the N-well will completely deplete the vertical region of the P-type epitaxial layers 55 and 59 to reduce the vertical parasitic capacitance.

FIG. 9, which includes FIG. 9a, is a cross-sectional view of a part of the TVS circuit using a merged diode/clamp device structure in alternate embodiments of the present invention. FIG. 9a illustrates the circuit diagram of the TVS circuit 130 using the merged diode/clamp device structure in some embodiments. Referring to FIG. 9a, the TVS circuit 130 includes two sets of steering diode and merged device coupled to provide surge protection for two input-output (I/O) terminals I/O1 and I/O2. More specifically, the low-side steering diode for I/O terminal I/O1 and the low-side steering diode for the I/O terminal I/O2 are each formed using a merged diode-clamp device, denoted as MDL1 and MDL2 respectively. A separate clamp device or clamp circuit is not used. Instead, the clamp device is merged in with one of the steering diodes at each I/O terminal.

The cross-section of FIG. 9 illustrates circuit elements of the TVS circuit 130 including the high-side steering diode DH1 and the merged diode-clamp device MDL2. Referring to FIG. 9, the TVS circuit 130 is fabricated on an N+ substrate 50. In the present embodiment, an N-type epitaxial layer 52 is formed on the N+ substrate 50. In alternate embodiments, a P-type epitaxial layer can be formed on the N+ substrate 50 instead. Then, N-type buried layer (NBL) 56 and a Resurf P-type buried layer (R-PBL) 54 are selectively formed on the N-type epitaxial layer 52. Then a second N-type epitaxial layer 58 is formed on the N and P-type buried layers. The semiconductor structure for forming the TVS circuit is thus constructed. The semiconductor structure used in FIG. 9 is similar to the one used in FIGS. 5 and 6.

In TVS circuit 130, the high-side steering diode DH1 (and similarly the high-side steering diode DH2) is constructed in a similar manner as the steering diode in the TVS circuit 100 of FIG. 6, but without the P-type buried layer 53 used in TVS circuit 100 of FIG. 6. In operation, a vertical depletion region is formed from PCOMP region 64 to the N-Epitaxial layer 52 at a bias voltage of 0V to reduce the vertical parasitic capacitance as seen by the I/O terminal I/O1.

In the merged diode/clamp device MDL2, the PN junction for the high-side steering diode is formed by the P+ region 74 to the N-well region 72. The entire vertical junction area from N-well region 72 to the N-Epitaxial layer 52 is depleted at 0V bias voltage to reduce the vertical parasitic capacitance as seen by the I/O terminal I/O1.

Meanwhile, the clamp device, formed as a SCR, is integrated with the high-side steering diode. More specifically, the PNP bipolar transistor Q1 of the SCR is formed by the P+ region 74 as the emitter, the N-well region 72 as the base, and the P-well region 80 as the collector. The NPN bipolar transistor Q2 of the SCR is formed by N-well region 72 as the collector, P-well region 80 as the base and N+ region 78 as the emitter. The base of the PNP transistor Q1 is the same as the collector of the NPN transistor Q2 and the base of the NPN transistor Q2 is the same as the collector of the PNP transistor Q1. As thus configured, a SCR is formed with the P+ region 74 as the anode and the N+ region 78 as the cathode and the P-well region 80 as the control terminal of the SCR. The anode of the SCR is electrically connected to node N1 through the metal contact 89 and the cathode of the SCR is electrically connected to the I/O terminal I/O2 through the metal contact 88. The P-well region 80 is electrically connected to the I/O terminal I/O2 through the heavily doped P+ contact region 82.

Figure 10:
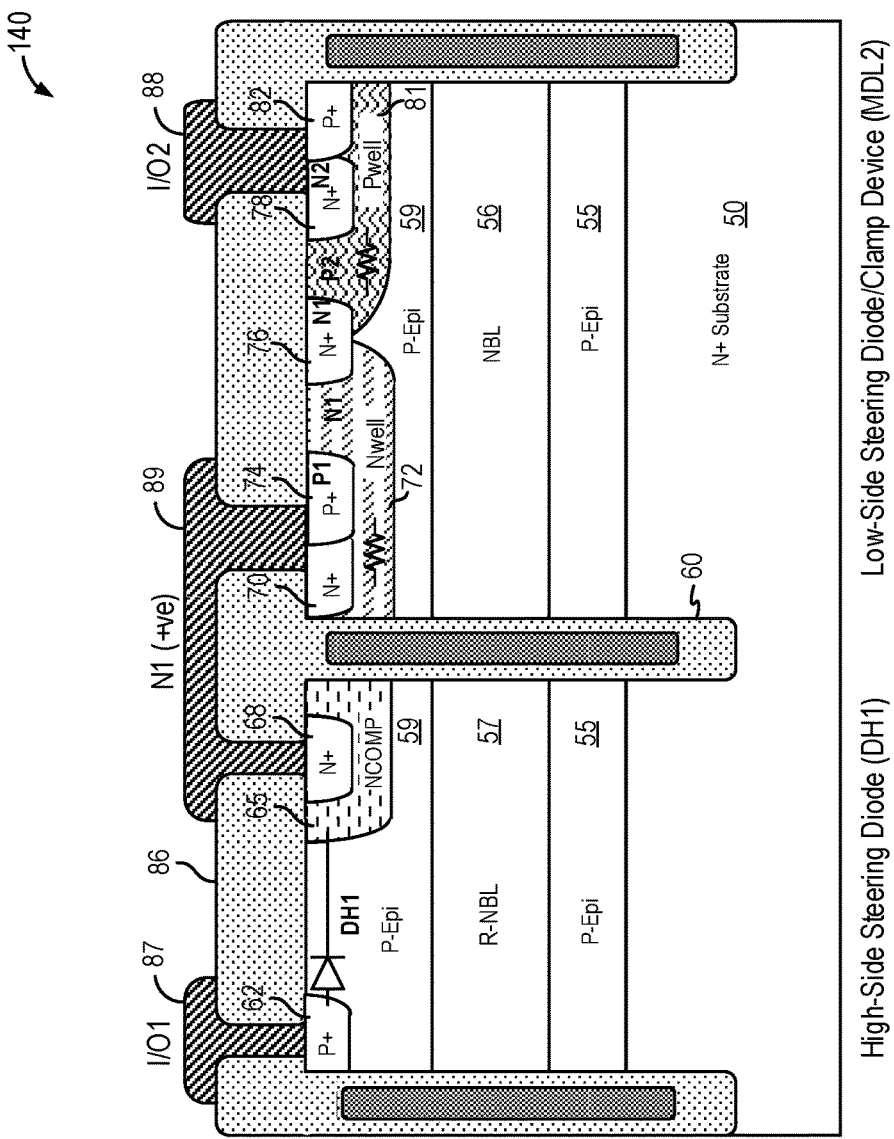
FIG. 10, which includes
Figure 10A:
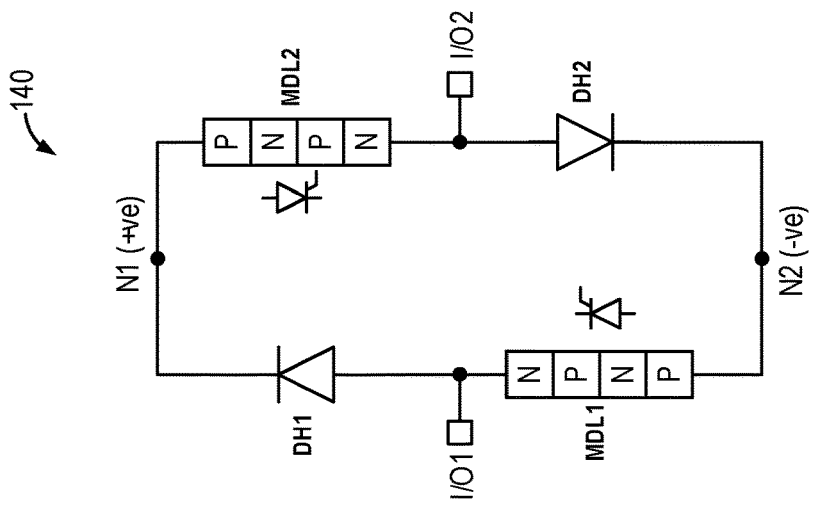
FIG. 10a, is a cross-sectional view of a part of the TVS circuit using a merged diode/clamp device structure in alternate embodiments of the present invention.

FIG. 10, which includes FIG. 10a, is a cross-sectional view of a part of the TVS circuit using a merged diode/clamp device structure in alternate embodiments of the present invention. The TVS circuit 140 of FIG. 10a is the same as the TVS circuit 130 of FIG. 9a. Referring to FIG. 10, the TVS circuit 140 of FIG. 10 is fabricated in a similar manner as the TVS circuit 130 of FIG. 9 except for the use of P-type epitaxial layers 55 and 59 instead of the N-type epitaxial layers 52 and 58 in FIG. 9. In particular, the TVS circuit 110 is fabricated on the N+ substrate 50. The P-type epitaxial layer 55 is formed on the N+ substrate 50. Then, N-type buried layer (NBL) 56 and Resurf N-type buried layer (R-NBL) 57 are selectively formed on the P-type epitaxial layer 55. Then, a second P-type epitaxial layer 59 is formed on the N and P-type buried layers. The semiconductor structure for forming the TVS circuit is thus constructed.

In TVS circuit 140, the high-side steering diode DH1 (and similarly for the low-side steering diode DL2) is formed in an active region isolated by trench isolation structures 60. The steering diode is formed as a PN junction diode with the anode formed by the P+ region 62 in the P-Epitaxial layer 59 and the cathode formed by an N-type region 65. A metal contact 87 is made through the dielectric layer 86 to the P+ region 74 to form the anode terminal. In the present embodiment, the N-type region 65 is formed using the doping level typically used for an N-type compensation region and is therefore referred to as the NCOMP region 65. The doping level of the NCOMP region 65 is higher than the doping level of the P-type epitaxial layer 59 but is lower than the heavily doped N+ region 68 used to make ohmic contact to the NCOMP region 65. In one example, the NCOMP region 65 has a doping level of $1 \times 10^{13}$ cm$^{-3}$ to $1 \times 10^{15}$ cm$^{-3}$ and the N-well region 72 has a doping level about $1 \times 10^{16}$ cm$^{-3}$ to $5 \times 10^{16}$ cm$^{-3}$. A metal contact 89 is made in the dielectric layer 86 to the N+ region 68 to form the cathode terminal. In operation, a vertical depletion region is formed from NCOMP region 65 to the P-Epitaxial layer 55 at a bias voltage of 0V to reduce the vertical parasitic capacitance as seen by the I/O terminal I/O2. The R-NBL layer 57 is completely depleted at the bias voltage of 0V by the NCOMP region 65.

In the merged diode/clamp device MDL2, the PN junction for the high-side steering diode is formed by the N-well region 72 to the P-well region 81. The entire vertical junction area from N-well region 72 to the P-Epitaxial layer 55 is depleted at 0V bias voltage to reduce the vertical parasitic capacitance as seen by the I/O terminal I/O1.

Meanwhile, the clamp device, formed as a SCR, is integrated with the high-side steering diode. More specifically, the PNP bipolar transistor Q1 of the SCR is formed by the P+ region 74 as the emitter, N-well region 72 as the base, and a P-well region 81 as the collector. The P-well region 81 is more heavily doped than the P-Epitaxial layer 59 but more lightly doped than the P+ region 74. In one example, the P-well region 81 has a doping level about $1 \times 10^{16}$ cm$^{-3}$ to $5 \times 10^{16}$ cm$^{-3}$. The NPN bipolar transistor Q2 of the SCR is formed by N-well region 72 as the collector, the P-well region 81 as the base and N+ region 78 as the emitter. The base of the PNP transistor Q1 is the same as the collector of the NPN transistor Q2 and the base of the NPN transistor Q2 is the same as the collector of the PNP transistor Q1. As thus configured, a SCR is formed with the P+ region 74 as the anode and the N+ region 78 as the cathode and the P-well region 81 as the control terminal of the SCR. The anode of the SCR is electrically connected to the node N1 through the metal contact 89 and the cathode of the SCR is electrically connected to the I/O terminal I/O2 through the metal contact 88. The P-well region 81 is electrically connected to the I/O terminal I/O2 through the heavily doped P+ contact region 82.

In the embodiment shown in FIG. 10, an N+ substrate is used. In alternate embodiments, a P+ substrate can be used, as shown by the embodiment in FIG. 7.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A bidirectional transient voltage suppressing (TVS) device comprising: a semiconductor layer comprising a first epitaxial layer of a first conductivity type, first and second buried layers of opposite conductivity types formed on the first epitaxial layer in selected areas, and a second epitaxial layer of the first conductivity type formed on the first and second buried layers;
   a plurality of active regions formed in the semiconductor layer, the active regions being isolated from each other by isolation structures;
   a first diode formed in a first active region of the plurality of active regions, the first active region being formed in an area of the semiconductor layer comprising the second buried layer of a second conductivity type, opposite to the first conductivity type, the first diode comprising a first region of the second conductivity type formed in the second epitaxial layer, the first region being an anode and the second epitaxial layer being a cathode of the first diode, wherein the second buried layer and the first and second epitaxial layers in the first active region is depleted at a bias voltage of zero volt, reducing a vertical parasitic capacitance at the anode of the first diode; and
   a merged diode/clamp device formed in a second active region of the plurality of active regions, the second active region being formed in an area of the semiconductor layer comprising the first buried layer of the first conductivity type and the second buried layer of the second conductivity type, the merged diode/clamp device comprising a second diode integrated with a silicon controlled rectifier (SCR), the second diode being formed in a second region of the second conductivity type formed in the second epitaxial layer above the second buried layer, the second region being an anode and the second epitaxial layer being a cathode of the second diode, and the SCR having an anode being the second region, a cathode, and a gate, wherein the second buried layer and the first and second epitaxial layers in the second active region are depleted at a bias voltage of zero volt, reducing a vertical parasitic capacitance at the anode of the second diode,
   wherein the anode of the second diode is coupled to a first protected node and the cathode of the first diode is coupled to a second protected node, the anode of the second diode is coupled to the anode of the SCR and the anode of the first diode is coupled to the cathode of the SCR, and wherein in response to a voltage applied to one of the protected nodes exceeding a first voltage level, the SCR conducts and clamps a voltage at the respective protected node at a clamping voltage.

2. The bidirectional TVS device of claim 1, wherein the merged diode/clamp device further comprises:
   a first well of the first conductivity type formed in the second epitaxial layer above the first buried layer and spaced apart from the second region;

a second well of the second conductivity type formed in the second epitaxial layer adjacent the first well, the second well forming the gate of the SCR;

a third region of the first conductivity type formed in contact with the first and second wells; and a fourth region of the first conductivity type formed in the second well, the fourth region forming the cathode of the SCR.

3. The bidirectional TVS device of claim 1, wherein the first active region further comprises a third buried layer of the second conductivity type formed under the second buried layer, the third buried layer being more heavily doped than the second buried layer.

4. The bidirectional TVS device of claim 1, wherein the first region comprises a heavily doped region of the second conductivity type formed in a lightly doped region of the second conductivity type, the lightly doped region and the second buried layer being provided to deplete the first and second epitaxial layers at the bias voltage of zero volt.

5. The bidirectional TVS device of claim 1, wherein the first diode further comprises a fifth region of the first conductivity type and being heavily doped formed in the second epitaxial layer and spaced apart from the first region.

6. The bidirectional TVS device of claim 5, wherein the first diode further comprises a tungsten plug formed in the fifth region, the tungsten plug being formed as a shallow trench in the fifth region.

7. The bidirectional TVS device of claim 1, further comprising a semiconductor substrate of the first conductivity type and being heavily doped, the semiconductor layer being formed on the semiconductor substrate.

8. The bidirectional TVS device of claim 1, wherein each of the isolation structures comprises an oxide filled trench isolation structure.

9. The bidirectional TVS device of claim 1, wherein each of the isolation structures comprises a trench isolation structure, each trench being lined with an oxide layer and filled with a polysilicon layer.

10. The bidirectional TVS device of claim 1, wherein the first conductivity type comprises N-type conductivity and the second conductivity type comprises P-type conductivity.

* * * * *